(12) United States Patent
Hayashi et al.

(10) Patent No.: US 7,120,181 B1
(45) Date of Patent: Oct. 10, 2006

(54) SEMICONDUCTOR LASER DEVICE AND METHOD OF FABRICATING THE SAME

(75) Inventors: Nobuhiko Hayashi, Osaka (JP);
Takenori Goto, Moriguchi (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/532,786

(22) Filed: Mar. 22, 2000

(30) Foreign Application Priority Data

Mar. 24, 1999 (JP) ............................ 11-079469

(51) Int. Cl.
*H01S 5/00* (2006.01)

(52) U.S. Cl. ........................... 372/46; 372/45; 257/103; 257/190; 438/46; 438/479

(58) Field of Classification Search ................. 257/103, 257/190; 372/45; 438/46, 479
See application file for complete search history.

(56) References Cited

U.S. PATENT DOCUMENTS

| | | | | |
|---|---|---|---|---|
| 4,433,417 A | * | 2/1984 | Burnham et al. | 372/45.01 |
| 5,932,896 A | * | 8/1999 | Sugiura et al. | 257/94 |
| 5,953,357 A | * | 9/1999 | Hirata et al. | 372/46 |
| 5,963,572 A | * | 10/1999 | Hiroyama et al. | 372/46 |
| 6,031,858 A | * | 2/2000 | Hatakoshi et al. | 372/46 |
| 6,064,079 A | * | 5/2000 | Yamamoto et al. | 257/101 |
| 6,162,656 A | * | 12/2000 | Kunisato et al. | 438/46 |
| 6,232,623 B1 | * | 5/2001 | Morita | 257/103 |
| 6,256,331 B1 | * | 7/2001 | Kitoh et al. | 372/46 |
| 6,294,440 B1 | * | 9/2001 | Tsuda et al. | 438/479 |
| 6,303,405 B1 | * | 10/2001 | Yoshida et al. | 438/46 |
| 6,319,742 B1 | * | 11/2001 | Hayashi et al. | 438/46 |
| 6,320,209 B1 | * | 11/2001 | Hata et al. | 257/190 |
| 6,370,176 B1 | * | 4/2002 | Okumura | 372/45 |
| 6,456,640 B1 | * | 9/2002 | Okumura | 372/46 |
| 6,534,800 B1 | * | 3/2003 | Ohbo et al. | 257/103 |
| 6,580,736 B1 | * | 6/2003 | Yoshie et al. | 372/45 |
| 2003/0053504 A1 | * | 3/2003 | Bour et al. | 372/46 |

FOREIGN PATENT DOCUMENTS

| | | |
|---|---|---|
| JP | 9-246651 | 9/1997 |
| JP | 10-075011 | 3/1998 |
| JP | 10-270786 | 10/1998 |
| JP | 10-294529 | 11/1998 |

OTHER PUBLICATIONS

"Low–Noise AlGaAs Lasers Grown by Organo–Metallic Vapor Phase Epitaxy", *IEEE Jouranl of Quantum Electronics*, vol. 25, No. 6 (Jun. 1989), pp. 1483–1488.
"A Theoretical Analysis of Self–Sustained Pulsation Phenomena in Narrow–Stripe Semiconductor Lasers", *IEEE Journal of Quantum Electronics*, vol. 29, No. 5 (May 1993), pp. 1330–1336.
Copy of Japanese Patent Office Action for corresponding Japanese Patent Application No. 11–079469 dated Apr. 22, 2003.

* cited by examiner

*Primary Examiner*—Armando Rodriguez
(74) *Attorney, Agent, or Firm*—Armstrong, Kratz, Quintos, Hanson & Brooks, LLP (57) ABSTRACT

In a semiconductor laser device, an AlGaN buffer layer, a GaN layer, an n-GaN layer, an n-AlGaN cladding layer, an MQW light emitting layer, a p-AlGaN cladding layer, a p-first GaN cap layer, a current blocking layer composed of n-AlGaN, and a p-second GaN cap layer are stacked in this order on a sapphire substrate, and a ridge portion having an upper surface having a width $W_1$ is formed by etching. The current blocking layer has an opening having a width $W_2$ on the upper surface of the ridge portion. The width $W_2$ of the opening is smaller than the width $W_1$ of the upper surface of the ridge portion. Accordingly, in a light emitting region of the MQW light emitting layer, a saturable light absorbing region is formed on both sides of a current injection region.

16 Claims, 7 Drawing Sheets

SEMICONDUCTOR LASER DEVICE AND METHOD OF FABRICATING THE SAME

BACKGROUND OF THE INVENTION

1. Field of the Invention

The present invention relates to semiconductor laser devices having compound semiconductor layers composed of III–V group nitride based semiconductors (hereinafter referred to as nitride based semiconductors) such as BN (boron nitride), GaN (gallium nitride), AlN (aluminum nitride), TlN (thallium nitride) or InN (indium nitride) or their mixed crystal and methods of fabricating the same.

2. Description of the Background Art

As light sources of optical disk systems for recording and reproducing optical disks, semiconductor laser devices have been employed. Particularly, expectations have been growing that nitride based semiconductor laser devices such as GaN based semiconductor laser devices are used as light sources for high-density optical disk systems such as new generation digital video disks.

Figure 6:
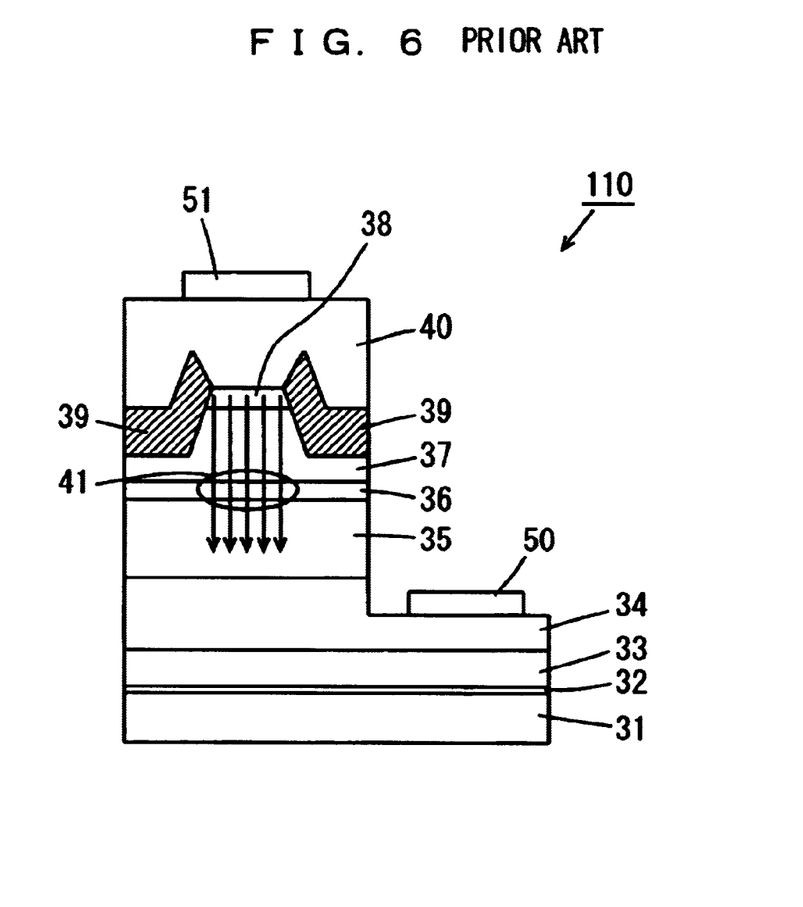
FIG. 6 is a schematic sectional view showing an example of a GaN based semiconductor laser device.

FIG. 6 is a schematic sectional view showing an example of a GaN based semiconductor laser device.

In a semiconductor laser device 110 shown in FIG. 6, an AlGaN buffer layer 32, an undoped GaN layer 33, an n-GaN layer 34, an n-AlGaN cladding layer 35, a multi quantum well light emitting layer (hereinafter referred to as an MQW light emitting layer) 36, a p-AlGaN cladding layer 37, a p-first GaN cap layer 38, a current blocking layer 39 composed of n-AlGaN and having an opening, and a p-second GaN cap layer 40 are stacked in this order on a sapphire substrate 31.

The semiconductor laser device 110 has a ridge waveguide structure. A ridge portion is constituted by the p-AlGaN cladding layer 37 and the p-first GaN cap layer 38. The opening of the current blocking layer 39 is formed on the ridge portion.

A partial region from the p-second GaN cap layer 40 to the n-GaN layer 34 is etched, so that an n type electrode 50 is formed on the exposed n-GaN layer 34. On the other hand, a p type electrode 51 is formed on the p-second GaN cap layer 40.

In the semiconductor laser device 110, a current injected from the p type electrode 51 is narrowed by the current blocking layer 39. Therefore, a striped region in the ridge portion under the opening of the current blocking layer 39 becomes a current injection region, as indicated by arrows in FIG. 6. Consequently, a region 41 at the center of the MQW light emitting layer 36 emits light. Further, the refractive index in the current blocking layer 39 composed of n-AlGaN is set to be lower than the refractive index in the p-AlGaN cladding layer 37 in the ridge portion, whereby the effective refractive index in a region 41 at the center of the MQW light emitting layer 36 is higher than the effective refractive index in a region on both sides thereof. Consequently, light is confined in the region 41 at the center of the MQW light emitting layer 36. Transverse mode control is thus carried out in the semiconductor laser device 110.

In the semiconductor laser device 110, low-noise characteristics are required at the time of reproducing the optical disk. In the semiconductor laser device 110 lasing in a single mode, however, laser light has strong coherence, so that noise occurs by light returned from the optical disk. Therefore, a semiconductor laser device in which a region having saturable light absorbing characteristics (hereinafter referred to as a saturable light absorbing region) is formed by forming a low current injection region in the MQW light emitting layer 36 has been proposed. In the semiconductor laser device, low-noise characteristics are achieved by subjecting the laser light to self-sustained pulsation.

Figure 7:
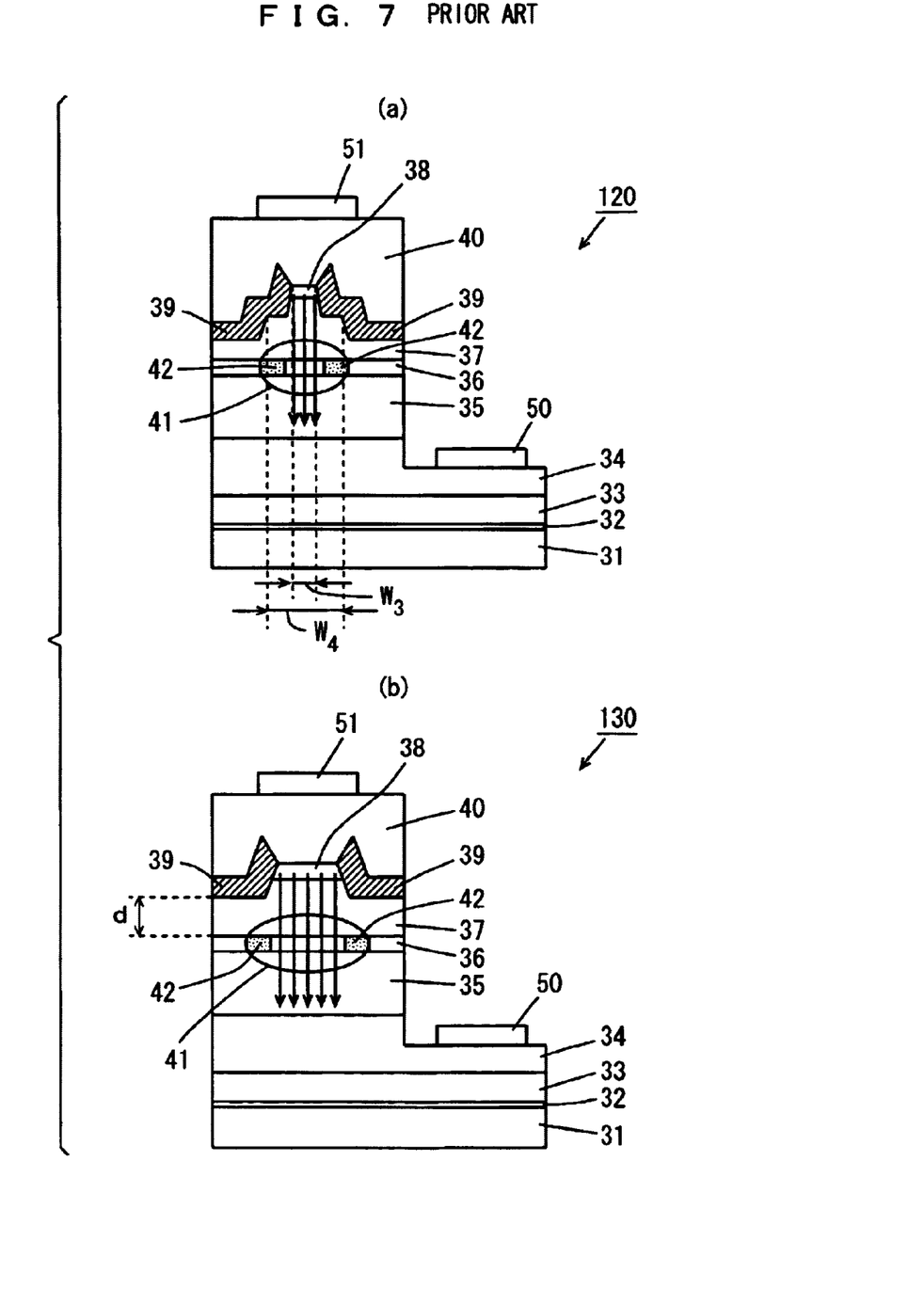
FIG. 7 is a schematic sectional view showing an example of a semiconductor laser device having low-noise characteristics.

FIGS. 7(a) and 7(b) are schematic sectional views showing an example of a semiconductor laser device having low-noise characteristics.

A semiconductor laser device 120 shown in FIG. 7(a) has the same structure as the semiconductor laser device 110 shown in FIG. 6 except for the following.

In the semiconductor laser device 120, when a ridge portion is formed by etching, steps are further formed in a p-AlGaN cladding layer 37 so that the width $W_3$ of the upper step is smaller than the width $W_4$ of the lower step. Consequently, a striped region having the width $W_3$ in the ridge portion becomes a current injection region, and a saturable light absorbing region 42 is formed on both sides of the current injection region in an MQW light emitting layer 36. As a result, laser light is subjected to self-sustained pulsation.

On the other hand, a semiconductor laser device 130 shown in FIG. 7(b) has the same structure as the semiconductor laser device 110 shown in FIG. 6 except for the following.

In the semiconductor laser device 130, the etching depth in forming a ridge portion is controlled, to increase the thickness d of a p-AlGaN cladding layer 37. Consequently, a striped region in the ridge portion becomes a current injection region, as indicated by arrows in FIG. 7(b). By increasing the thickness d of the p-AlGaN cladding layer 37, the difference in the effective refractive index in the horizontal direction is decreased in an MQW light emitting layer 36. Accordingly, light oozes out in the horizontal direction into a region, excluding a region under the ridge portion, of the MQW light emitting layer 36. Consequently, a saturable light absorbing region 42 is formed on both sides of the current injection region in the MQW light emitting layer 36. As a result, laser light is subjected to self-sustained pulsation.

A nitride based semiconductor layer such as a GaN based semiconductor layer is chemically stable. Therefore, the nitride based semiconductor layer cannot be patterned by wet etching, unlike a GaAs based semiconductor layer used for the conventional semiconductor laser device emitting red light or infrared light, and must be patterned by dry etching such as RIE (Reactive Ion Etching) or RIBE (Reactive Ion Beam Etching). In such dry etching, selective etching cannot be performed. Accordingly, it is difficult to control the etching with high precision. Consequently, it is difficult to accurately form the structures of the above-mentioned semiconductor laser device 120 and 130.

SUMMARY OF THE INVENTION

An object of the present invention is to provide a semiconductor laser device having low-noise characteristics which can be easily fabricated and a method of fabricating the same.

A semiconductor laser device according to an aspect of the present invention comprises a first nitride based semiconductor layer including a light emitting layer and containing at least one of indium, gallium, aluminum, boron and thallium; a ridge portion formed in a region having a predetermined width on the first nitride based semiconductor layer, having an upper surface having a first width, and containing at least one of indium, gallium, aluminum, boron and thallium; a current blocking layer formed on the first nitride based semiconductor layer and on the ridge portion, and having an opening having a second width smaller than the first width on the upper surface of the ridge portion; and a second nitride based semiconductor layer formed on the ridge portion inside the opening and containing at least one of indium, gallium, aluminum, boron and thallium.

In the semiconductor laser device, the ridge portion having the upper surface having the first width is formed in the region having the predetermined width on the first nitride based semiconductor layer. The current blocking layer is formed on a region from a side surface of the ridge portion to the upper surface thereof. In the current blocking layer, the opening having the second width is formed on a predetermined region on the upper surface of the ridge portion. The width (the second width) of the opening is smaller than the width (the first width) of the upper surface of the ridge portion.

In the semiconductor laser device, a current injected into the second nitride based semiconductor layer is narrowed by the current blocking layer. Consequently, the current is injected into the ridge portion under the opening having the second width, whereby an optical waveguide is formed in the light emitting layer below the ridge portion. In this case, the width (the second width) of a current injection region under the opening is smaller than the width (the first width) of the upper surface of the ridge portion. In the light emitting layer below the ridge portion, therefore, a region which emits light other than the current injection region, that is, a region having saturable light absorbing characteristics (a saturable light absorbing region) is formed. Consequently, laser light can be subjected to self-sustained pulsation. Therefore, a semiconductor laser device having low-noise characteristics is obtained.

In the above-mentioned semiconductor laser device, the current blocking layer is formed in a region, excluding the region having the second width, on the upper surface of the ridge portion, so that the region having saturable light absorbing characteristics is formed in the light emitting layer. In the semiconductor laser device, the necessity of etching for forming the saturable light absorbing region is thus eliminated. Therefore, a semiconductor laser device having low-noise characteristics is easily obtained.

The current blocking layer may be composed of a nitride based semiconductor containing at least one of indium, gallium, aluminum, boron and thallium.

The current blocking layer composed of the above-mentioned material can be grown in the transverse direction in the region, excluding the opening, on the upper surface of the ridge portion by being grown under predetermined growth conditions. Consequently, the current blocking layer having the opening having the second width is easily formed. The current injected into the second nitride based semiconductor layer is narrowed by the current blocking layer thus formed. Consequently, the region under the opening having the second width smaller than the first width of the upper surface of the ridge portion becomes a current injection region. Further, light is confined horizontally in the light emitting layer, so that transverse mode control can be carried out.

The first nitride based semiconductor layer may comprise an n-type cladding layer, the light emitting layer, and a first p-type cladding layer, and the ridge portion may comprise a second p-type cladding layer.

In this case, it is difficult to increase the hole concentrations in the first and second p-type cladding layers. Accordingly, the first and second p-type cladding layers have high resistances. In the first and second p-type cladding layers having high resistances, the injected current is injected into the region under the opening narrower than the upper surface of the ridge portion without being widened. Consequently, the width of the current injection region is smaller than the width of the upper surface of the ridge portion.

The current blocking layer may contain aluminum and gallium. In this case, the refractive index in the current blocking layer is set to a refractive index lower than the refractive index in the ridge portion. Consequently, the effective refractive index in a region of the light emitting layer below the ridge portion is made higher than the effective refractive index in a region on both sides thereof. Consequently, light is confined in the light emitting layer, so that transverse mode control is carried out. A semiconductor laser device having a real refractive index guided structure is thus realized.

It is preferable that the ratio of the first width of the upper surface of the ridge portion to the second width of the opening of the current blocking layer is not less than 0.1 nor more than 0.95. In this case, a saturable light absorbing region is formed in the semiconductor laser device.

The current blocking layer may contain indium and gallium. In this case, light emitted in the region of light emitting layer below the current blocking layer is absorbed by the current blocking layer. Consequently, the light is concentrated on the region of the light emitting layer below the ridge portion, so that transverse mode control is carried out. A semiconductor laser device having a loss guided structure is thus realized.

The second nitride based semiconductor layer may be formed so as to cover a region above the opening and a region on the current blocking layer. The semiconductor laser device may further comprise an electrode formed on the second nitride based semiconductor layer.

In the second nitride based semiconductor layer formed on the region above the opening and the region on the current blocking layer, a recess having a width corresponding to the width of the opening is formed in the region above the opening. In the semiconductor laser device, the current blocking layer is also formed on the upper surface of the ridge portion. Accordingly, the width of the opening of the current blocking layer is made smaller than that in the conventional semiconductor laser device in which the current blocking layer is formed on only the side surface of the ridge portion. In the semiconductor laser device, therefore, the width of the recess formed in the region, above the opening, of the second nitride based semiconductor layer is smaller, as compared with that in the conventional semiconductor laser device. Consequently, the surface of the second nitride based semiconductor layer is flattened.

In the electrode formed on the second nitride based semiconductor layer whose surface has been thus flattened, the surface of the electrode is flattened. When the semiconductor laser device is mounted on a heat sink with the electrode directed downward (junction-down mounting), therefore, the contact area between the electrode and the heat sink is increased, thereby improving heat dissipation characteristics into the heat sink.

The current blocking layer may have a single-layer structure, or may have a multi-layer structure.

A method of fabricating a semiconductor laser device according to another aspect of the present invention comprises the steps of forming a first nitride based semiconductor layer including a light emitting layer and containing at least one of indium, gallium, aluminum, boron and thallium; forming a ridge portion having an upper surface having a first width, and containing at least one of indium, gallium, aluminum, boron and thallium in a region having a predetermined width on the first nitride based semiconductor layer; forming on the ridge portion a current blocking layer having an opening having a second width smaller than the first width on the upper surface of the ridge portion; and forming a second nitride based semiconductor layer containing at least one of indium, gallium, aluminum, boron and thallium on the ridge portion inside the opening.

In the method of fabricating the semiconductor laser device, the current blocking layer having the opening having the second width smaller than the first width is formed on the upper surface of the ridge portion having the first width. In the fabricated semiconductor laser device, therefore, a current injected into the second nitride based semiconductor layer is narrowed by the current blocking layer. Consequently, a current injection region is formed in a region under the opening having the second width smaller than the width of the upper surface of the ridge portion, and an optical waveguide is formed in the light emitting layer below the ridge portion. In this case, the width (the second width) of the current injection region is smaller than the width (the first width) of the upper surface of the ridge portion. In the light emitting layer below the ridge portion, therefore, a region which emits light other than the current injection region, that is, a region having saturable light absorbing characteristics is formed. Consequently, laser light can be subjected to self-sustained pulsation. Therefore, it is possible to fabricate a semiconductor laser device having low-noise characteristics.

In the above-mentioned semiconductor laser device, the saturable light absorbing region is formed in the light emitting layer by not etching but growing the current blocking layer in a region, excluding the region having the second width, on the upper surface of the ridge portion. Consequently, it is possible to easily fabricate a semiconductor laser device having low-noise characteristics.

The current blocking layer may be composed of a nitride based semiconductor containing at least one of indium, gallium, aluminum, boron and thallium, and the step of forming the current blocking layer may comprise the steps of forming a striped insulating film on the upper surface of the ridge portion, and forming the current blocking layer extending to a region, excluding the region having the second width, on the upper surface of the ridge portion from a region on the first nitride based semiconductor layer on both sides of the ridge portion by using a transverse growth technique.

In this case, the striped insulating film is formed on the upper surface of the ridge portion, and the current blocking layer having the opening is formed on the striped insulating film by using a transverse growth technique. The current blocking layer composed of the above-mentioned material can be easily grown in the transverse direction on the striped insulating film by being grown under predetermined conditions. Consequently, it is possible to easily form the current blocking layer having the opening having the second width smaller than the width of the upper surface of the ridge portion. The current blocking layer is formed in the above-mentioned manner, thereby making it possible to narrow a current injected into the second nitride based semiconductor layer and to take a region under the opening narrower than the upper surface of the ridge portion as a current injection region. Further, light is confirmed horizontally in the light emitting layer, so that transverse mode control can be carried out.

The step of forming the first nitride based semiconductor layer may comprise the step of forming an n-type cladding layer, the light emitting layer, and a p-type cladding layer in this order, and the step of forming the ridge portion may comprise the step of etching the p-type cladding layer, except in a region having the first width of the p-type cladding layer.

In this case, the ridge portion is formed in the p-type cladding layer in the first nitride based semiconductor laser by etching. It is difficult to increase the hole concentration in the p-type cladding layer composed of a nitride based semiconductor, so that the p-type cladding layer has a high resistance. In the p-type cladding layer having a high resistance, a current is injected into the region under the opening having the second width smaller than the width of the upper surface of the ridge portion without being widened. Consequently, it is possible to make the current injection region narrower than the ridge portion.

It is preferable that the current blocking layer contains gallium and aluminum, and the ratio of the first width of the upper surface of the ridge portion to the second width of the opening of the current blocking layer is not less than 0.1 nor less than 0.95. In this case, the refractive index in the current blocking layer is made lower than the refractive index in the ridge portion, thereby obtaining a semiconductor laser device having a real refractive index guided structure. Further, both the ridge portion and the current blocking layer are set such that the ratio of the first width of the upper surface of the ridge portion to the second width of the opening of the current blocking layer satisfies the above-mentioned conditions, thereby making it possible to form a saturable light absorbing region in the semiconductor laser device.

The step of forming the second nitride based semiconductor layer may comprise the step of forming the second nitride based semiconductor layer for covering a region above the opening and a region on the current blocking layer. Further, it may further comprise the step of forming an electrode on the second nitride based semiconductor layer.

In the second nitride based semiconductor layer thus formed, a recess having a width corresponding to the width of the opening is formed in the region above the opening.

In the semiconductor laser device fabricated by the above-mentioned fabricating method, the current blocking layer is formed also on the upper surface of the ridge portion. Accordingly, the width of the opening of the current blocking layer is made smaller, as compared with that in the conventional semiconductor laser device in which the current blocking layer is formed only on the side surface of the ridge portion. In the semiconductor layer device fabricated in the above-mentioned method, therefore, the width of the recess formed in the region, above the opening, of the second nitride based semiconductor layer can be made smaller, as compared with that in the conventional semiconductor laser device. Consequently, the surface of the second nitride based semiconductor layer is flattened.

Since the width of the recess formed in the region of the second nitride based semiconductor layer can be thus decreased, the surface of the electrode formed on the second nitride based semiconductor layer is flattened. When the semiconductor laser device fabricated in the above-mentioned method is mounted on a heat sink with the electrode directed downward (junction-down mounting), therefore, the contact area between the electrode and the heat sink is increased, thereby making it possible to improve heat dissipation characteristics into the heat sink.

The step of forming the current blocking layer may comprise the step of forming a single nitride based semiconductor layer containing at least one of indium, gallium, aluminum, boron and thallium. Alternately, the step of forming the current blocking layer may comprise the step of stacking a plurality of nitride based semiconductor layers containing at least one of indium, gallium, aluminum, boron and thallium.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
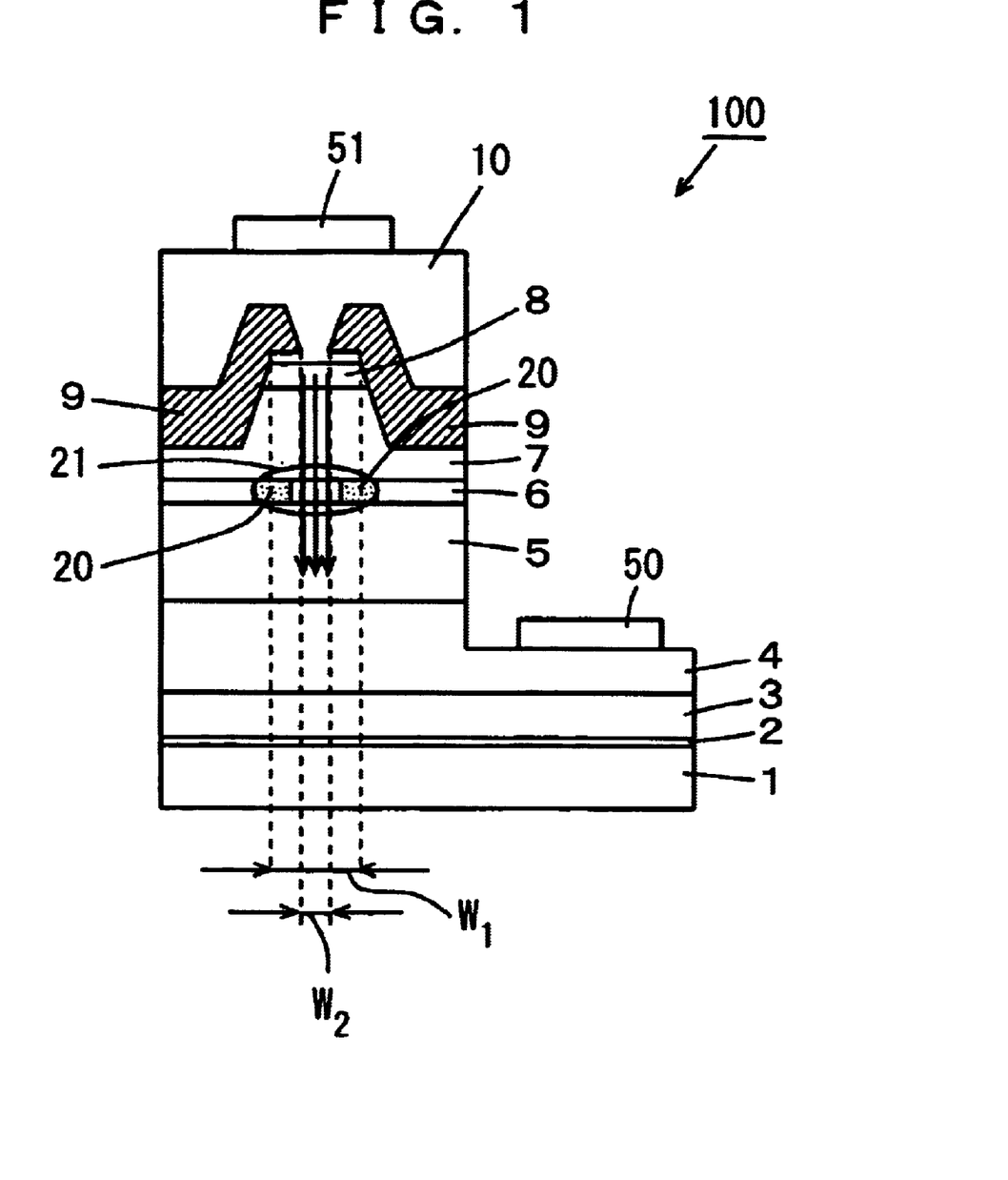
FIG. 1 is a schematic sectional view showing a GaN based semiconductor laser device in an embodiment of the present invention.

FIG. 1 is a schematic sectional view showing a GaN based semiconductor laser device in an embodiment of the present invention.

In a semiconductor laser device 100 shown in FIG. 1, an AlGaN buffer layer 2 having a thickness of 300 Å, an undoped GaN layer 3 having a thickness of 2 μm, an n-GaN layer 4 having a thickness of 3 μm, an n-AlGaN cladding layer 5 having a thickness of 0.7 μm, an MQW light emitting layer 6, a p-AlGaN cladding layer 7 having a thickness of 0.7 μm, a p-first GaN cap layer 8 having a thickness of 0.2 μm, a current blocking layer 9 having a thickness of 0.5 to 1.0 μm composed of n-AlGaN and having an opening, and a p-second GaN cap layer 10 having a thickness of 0.5 to 1.0 μm are stacked in this order on the C(0001) plane of a sapphire substrate 1.

In this case, Si is used as an n-type dopant, and Mg is used as a p-type dopant.

The MQW light emitting layer 6 has a multi quantum well structure obtained by alternately stacking six quantum barrier layers having a thickness of 60 Å composed of n-In$_{0.03}$Ga$_{0.97}$N and five quantum well layers having a thickness of 30 Å composed of In$_{0.18}$Ga$_{0.82}$N.

The semiconductor laser device 100 has a ridge waveguide structure. A ridge portion having an upper surface having a width W$_1$ is constituted by the p-first GaN cap layer 8 and the p-AlGaN cladding layer 7. An opening of the current blocking layer 9 is formed on a predetermined region on the ridge portion.

A partial region from the p-second GaN cap layer 10 to the n-GaN layer 4 is etched, so that an n type electrode 50 is formed on the exposed n-GaN layer 4. Further, a p type electrode 51 is formed on the p-second GaN cap layer 10.

In the semiconductor laser device 100, a current injected from the p type electrode 51 is narrowed by the current blocking layer 9. The refractive index in the current blocking layer 9 is set to a refractive index lower than the refractive index in the p-AlGaN cladding layer 7. Accordingly, the effective refractive index in a region 21 at the center of the MQW light emitting layer 6 is made higher than the effective refractive index in a region on both sides thereof. Consequently, light is confined in the region 21 having a width W$_1$ at the center of the MQW light emitting layer 6, so that transverse mode control is carried out. A semiconductor laser device 100 having a real refractive guided structure is thus realized. In the GaN based semiconductor laser device 100, it is difficult to increase the hole concentrations in the p-type semiconductor layers 7, 8, and 10. Accordingly, the narrowed current is injected into the p-type semiconductor layers 7 and 8 below the current blocking layer 9 without being widened. Consequently, a striped region having a width W$_2$ under the opening of the current blocking layer 9 becomes a current injection region, as indicated by arrows in FIG. 1. In this case, the width W$_2$ of the current injection region is smaller than the width W$_1$ of the upper surface of the ridge portion (W$_1$>W$_2$). In the light emitting region 21 in the MQW light emitting layer 6, a saturable light absorbing region 20 is formed on both sides of the current injection region. Accordingly, laser light is subjected to self-sustained pulsation. As a result, the width of a longitudinal mode spectrum of the laser light is increased so that the coherence of the laser light is decreased. Accordingly, the semiconductor laser device 100 is not easily subjected to noise.

Figure 2:
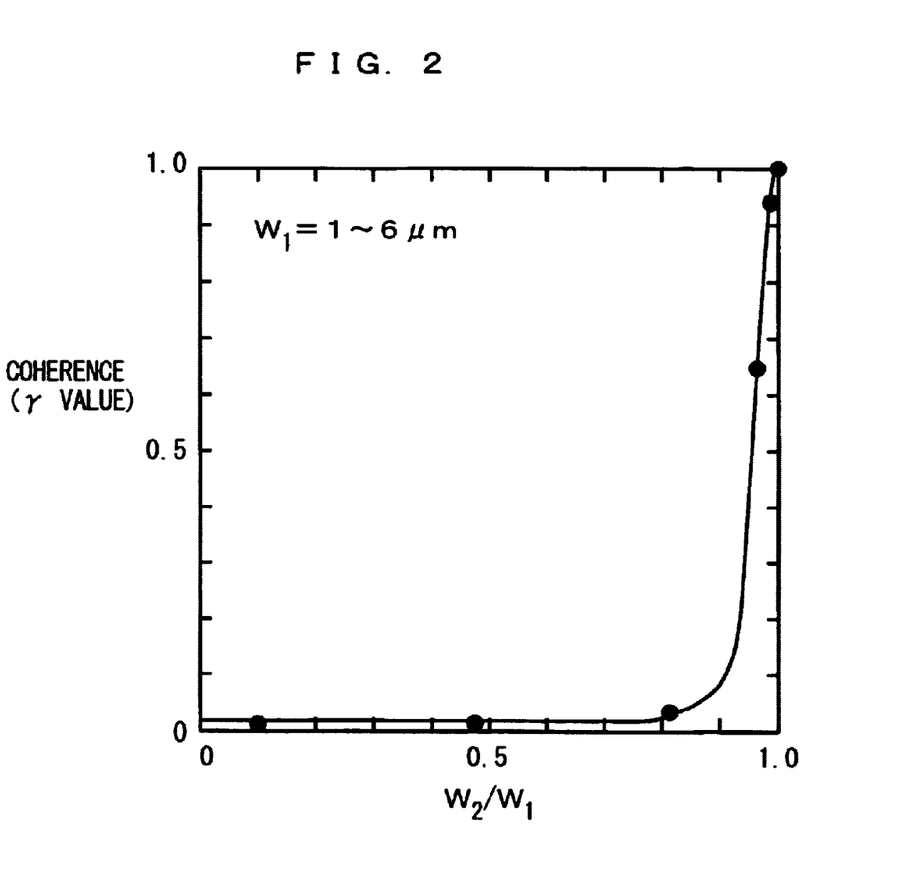
FIG. 2 is a diagram showing the ratio of the width of an upper surface of a ridge portion to the width of an opening of a current blocking layer and the coherence in the semiconductor laser device shown in FIG. 1.

FIG. 2 is a diagram showing the ratio of the width W$_1$ of the upper surface of the ridge portion to the width W$_2$ of the opening of the current blocking layer 9 and the coherence (γ value) in the semiconductor laser device 100.

As shown in FIG. 2, when the width W$_1$ of the upper surface of the ridge portion is 1 to 6 μm, the width W$_2$ of the opening is preferably 0.8 to 5.8 μm. When the ratio of W$_1$ to W$_2$ (W$_2$/W$_1$) is 0.1 to 0.95, the saturable light absorbing region is formed in the semiconductor laser device 100, thereby making self-sustained pulsation possible. Consequently, the coherence (γ value) in the semiconductor laser device 100 is not more than 0.5, so that low-noise characteristics are achieved. Further, when the ratio of W$_1$ to W$_2$ is 0.1 to 0.8, the coherence (γ value) in the semiconductor laser device 100 is the lowest, thereby making stable self-sustained pulsation possible.

Figure 3:
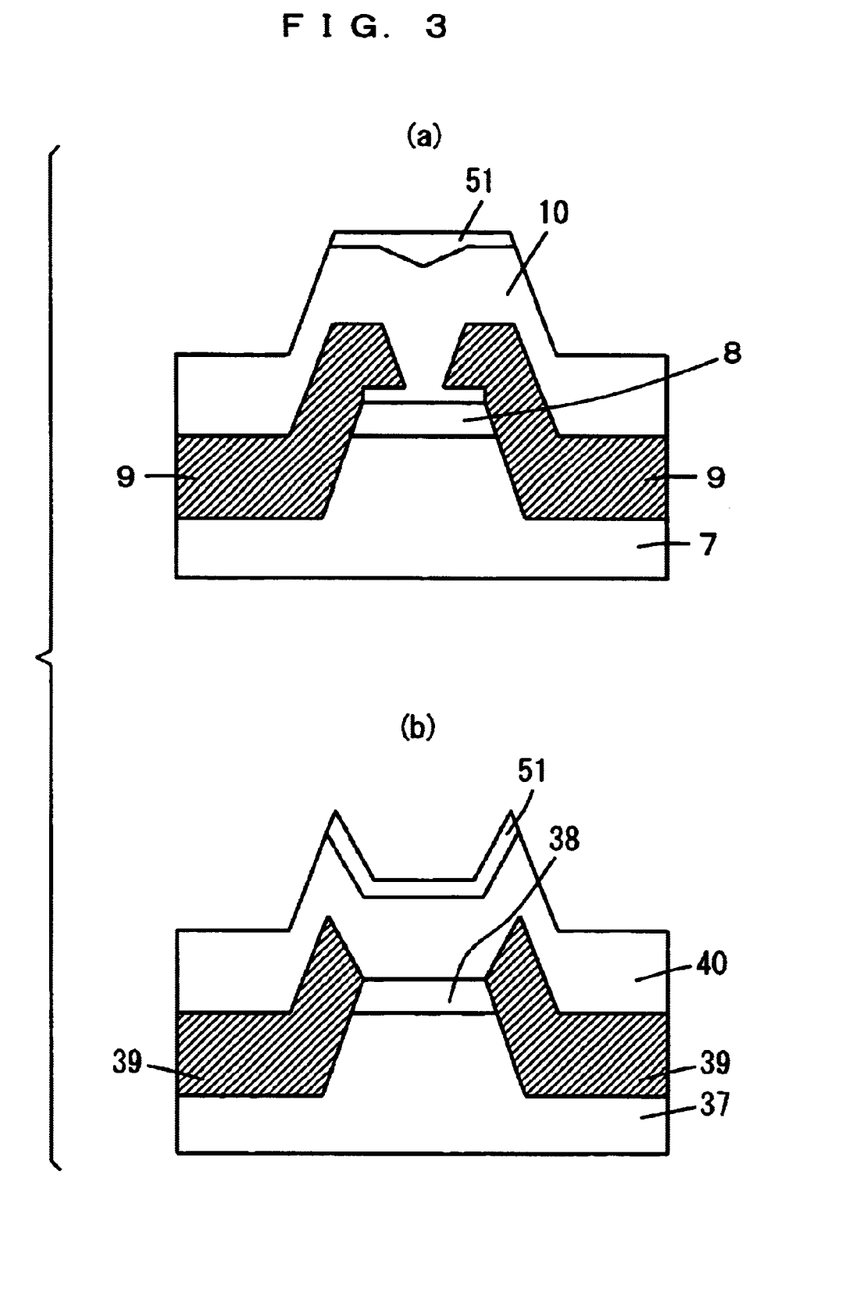
FIG. 3 is a partially enlarged sectional view of the semiconductor laser device shown in FIG. 1 and a semiconductor laser device shown in FIG. 6.

FIG. 3(a) is a partially enlarged sectional view showing the detailed structure of the semiconductor laser device shown in FIG. 1. As shown in FIG. 3(a), a surface of the p-second GaN cap layer 10 in the semiconductor laser device 100 is not actually flat, and a recess is formed in a region, above the opening of the current blocking layer 9, of the p-second GaN cap layer 10.

In the above-mentioned semiconductor laser device 100, the current blocking layer 9 is also formed on the upper surface of the ridge portion. Accordingly, the width of the opening of the current blocking layer 9 is decreased. Therefore, the width of the recess formed in the region, above the ridge portion, of the p-second GaN cap layer 10 is decreased. Since the width of the recess formed in the p-second GaN layer 10 is small in the semiconductor laser device 100, therefore, a surface of the p type electrode 51 formed on the p-second GaN cap layer 10 becomes flat.

On the other hand, FIG. 3(b) is a partially enlarged sectional view showing the detailed structure of the conventional semiconductor laser device shown in FIG. 6. As shown in FIG. 3(b), a surface of the p-second GaN cap layer 40 in the semiconductor laser device 110 is not actually flat, and a recess is formed in a region above the opening of the current blocking layer 39.

In the semiconductor laser device 110, the width of the opening of the current blocking layer 39 is larger than the width of the opening of the current blocking layer 9 in the semiconductor laser device 100. Therefore, the width of the recess formed in the p-second GaN cap layer 40 in the semiconductor laser device 110 is larger than the width of the recess formed in the p-second cap layer 10 in the semiconductor laser device 100. Since the width of the recess formed in the region, above the ridge portion, of the p-second GaN cap layer 40 is large in the semiconductor laser device 110, therefore, a surface of the p type electrode 51 formed on the p-second GaN cap layer 40 is not flat.

As described in the foregoing, in the semiconductor laser device 100, the surface of the p type electrode 51 is made flatter, as compared with that in the semiconductor laser device 110. When the semiconductor laser device 100 is mounted on a heat sink with the p type electrode 51 directed downward (junction-down mounting), the contact area between the p type electrode 51 and the heat sink in the semiconductor laser device 100 is made larger, as compared with that in the semiconductor laser device 110. Consequently, the semiconductor laser device 100 dissipates heat into the heat sink more satisfactorily, as compared with the semiconductor laser device 110.

The Al composition ratio of the current blocking layer 9 composed of n-AlGaN is set to not less than the Al composition ratio of the p-AlGaN cladding layer 7. Consequently, the refractive index in the current blocking layer 9 is smaller than the refractive index in the p-AlGaN cladding layer 7 in the ridge portion. In order not to decrease the crystallizability of the current blocking layer 9, it is preferable that the Al composition ratio is slightly lower. Consequently, the Al composition ratio of the current blocking layer 9 is set to 0.12 to 0.20, for example.

Although in the semiconductor laser device 100, Si is injected as n-type impurities into the current blocking layer 9, Zn may be injected as impurities in addition to Si. In this case, Zn has a high resistance. Accordingly, a current is narrowed in the current blocking layer 9 in which Zn has been injected.

Description is now made of a method of fabricating the semiconductor laser device 100.

Figure 4:
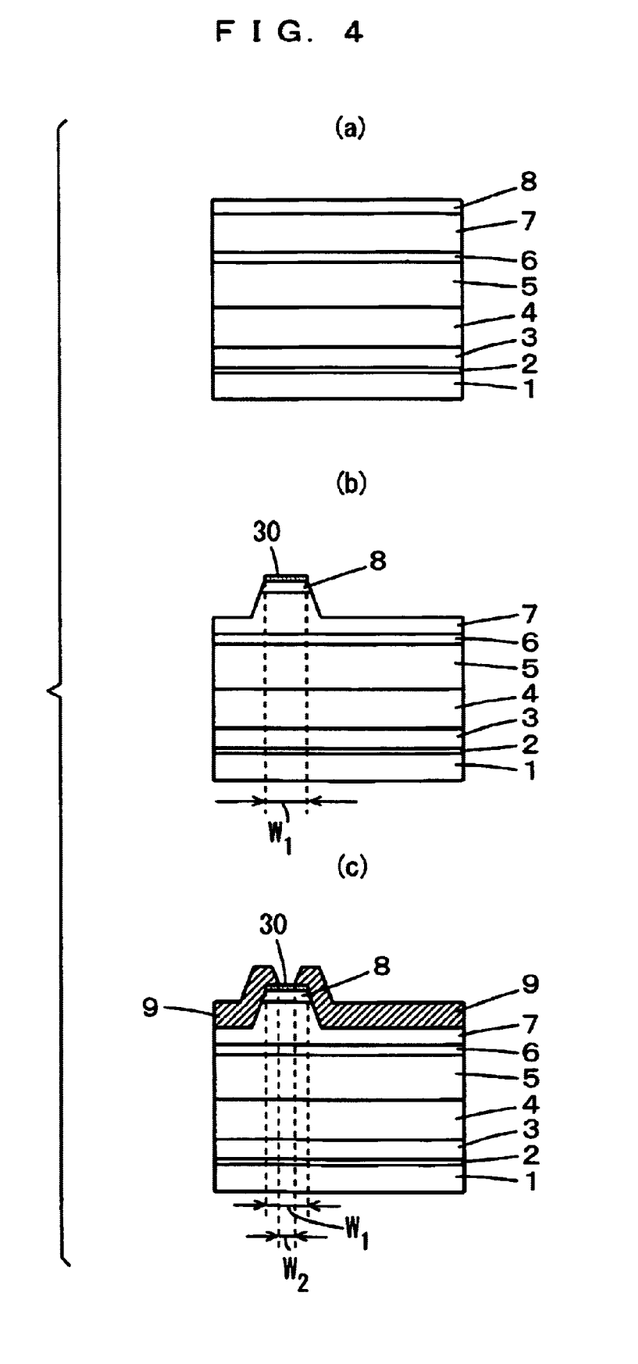
FIG. 4 is a schematic sectional view showing the steps of fabricating the semiconductor laser device shown in FIG. 1.
Figure 5:
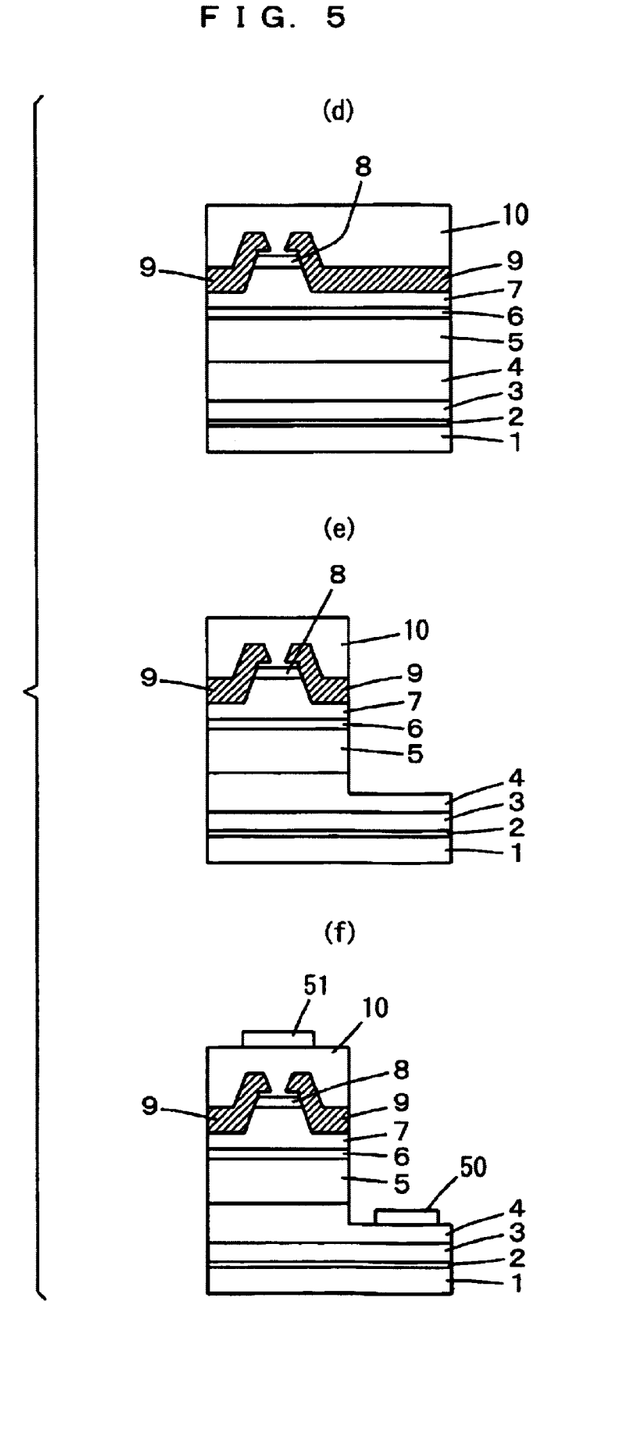
FIG. 5 is a schematic sectional view showing the steps of fabricating the semiconductor laser device shown in FIG. 1.

FIGS. 4 and 5 are schematic sectional views showing the steps of fabricating the semiconductor laser device 100.

As shown in FIG. 4(a), an AlGaN buffer layer 2, an undoped GaN layer 3, an n-GaN layer 4, an n-AlGaN cladding layer 5, an MQW light emitting layer 6, a p-AlGaN cladding layer 7, and a p-first GaN cap layer 8 are grown in this order on a sapphire substrate 1 by metal organic chemical vapor deposition (MOCVD). The respective substrate temperatures at the time of growing the layers 2 to 8 in this case are as shown in Table 1.

TABLE 1

| | Substrate Temperature at the Time of Growth (° C.) |
|---|---|
| AlGaN Buffer Layer 2 | 600 |
| GaN Layer 3 | 1050 |
| n-GaN Layer 4 | 1050 |
| n-AlGaN Cladding Layer 5 | 1050 |
| MQW Light Emitting Layer 6 | 800 |
| p-AlGaN Cladding Layer 7 | 1050 |
| p-First GaN Cap Layer 8 | 1050 |

As shown in FIG. 4(b), etching is then performed by RIE using chlorine, to form a ridge portion having an upper surface having a width $W_1$. Further, an $SiO_2$ film 30 is formed on the p-first GaN cap layer 8 in the ridge portion.

As shown in FIG. 4(c), a current blocking layer 9 composed of n-AlGaN is then grown on a region from a side surface to the upper surface of the ridge portion. In this case, the current blocking layer 9 is grown on the $SiO_2$ film 30, except in a region having a width $W_2$, by a transverse growth technique. Consequently, the current blocking layer 9 having a striped opening having a width $W_2$ is formed on the $SiO_2$ film 30.

The substrate temperature at the time of growing the current blocking layer 9 is set to 1000 to 1100° C., and other growth conditions, for example, material gas flow rate and growth time are set such that the current blocking layer 9 is easily grown in the transverse direction on the $SiO_2$ film 30. Further, the current blocking layer 9 must be selectively grown on a region, excluding the opening, on the $SiO_2$ film 30. Therefore, it is preferable that the current blocking layer 9 is grown under reduced pressure.

After the current blocking layer 9 is thus grown, the $SiO_2$ film 30 is removed by a hydrofluoric acid based etchant.

As described in the foregoing, the current blocking layer 9 is grown in the transverse direction on the upper surface of the ridge portion in this example. Accordingly, the width of the opening of the current blocking layer 9 formed on the upper surface of the ridge portion is smaller than the width of the opening of the current blocking layer 39 in the conventional semiconductor laser device 110 (FIG. 6).

As shown in FIG. 5, a p-second GaN cap layer 10 is then grown on the p-first GaN cap layer 8 inside the opening and the current blocking layer 9. The substrate temperature at the time of growth in this case is set to 1050° C. A surface of the p-second GaN cap layer 10 thus grown is not actually flat, and a recess is formed in a region, above the opening of the current blocking layer 9, of the p-second GaN cap layer 10, as described in FIG. 3(a).

Since the opening of the current blocking layer 9 is narrower than the opening of the current blocking layer 39 in the semiconductor laser device 110, as described above, the width of the recess formed in the p-second GaN cap layer 10 in the semiconductor laser device 100 is smaller than the width of the recess formed in the p-second GaN cap layer 40 in the semiconductor laser device 110.

Furthermore, as shown in FIG. 5(e), a partial region from the p-second GaN cap layer 10 to the n-GaN layer 4 is etched, to expose an type electrode forming region of the n-GaN layer 4.

Finally, as shown in FIG. 5(f), an n type electrode 50 is formed on the exposed n-GaN layer 4, and a p type electrode 51 is formed on the p-second GaN cap layer 10. In this case, the width of the recess formed in the p-second GaN cap layer 10 is small. Accordingly, the surface of the p type electrode 51 formed on the p-second GaN cap layer 10 is flattened, as shown in FIG. 3(a).

As described in the foregoing, in the method of fabricating the semiconductor laser device, the width $W_2$ of the current injection region is made smaller than the width $W_1$ of the ridge portion by not etching but selectively growing the current blocking layer 9 by using a transverse growth technique, to form a saturable light absorbing region 20. Even in the GaN based semiconductor laser device 100 in which it is difficult to control etching with high precision, therefore, it is possible to easily form the saturable light absorbing region 20. Consequently, it is possible to easily fabricate the semiconductor laser device 100 having low-noise characteristics.

According to the above-mentioned method, the width of the recess formed in the region, above the ridge portion, of the p-second GaN cap layer 10 can be decreased, to flatten the surface of the p type electrode 51. Consequently, a semiconductor laser device 100 having good heat dissipation characteristics can be fabricated when it is mounted on a heat sink with the p type electrode 51 directed downward (junction-down mounting).

Although in the above-mentioned embodiment, description was made of a case where the current blocking layer 9 is composed of n-AlGaN, the current blocking layer 9 may be composed of other materials.

For example, the current blocking layer 9 may be composed of InGaN in which Si or Zn has been injected as impurities. The In composition of the current blocking layer 9 composed of InGaN is approximately the same as or not less than that of the quantum well layer in the MQW light emitting layer 6, for example, 0.10 to 0.15. When the current blocking layer 9 is formed, light emitted in the region of the MQW light emitting layer 6 below the current blocking layer 9 is absorbed by the current blocking layer 9. Accordingly, the light is concentrated on the region 21 having the width $W_1$ at the center of the MQW light emitting layer 6, so that transverse mode control is carried out. A semiconductor laser device 100 having a loss guided structure is thus realized. Also in this case, the current blocking layer 9 is grown in the transverse direction on the $SiO_2$ film 30, thereby forming a current injection region having a width $W_2$. The substrate temperature at the time of growing the current blocking layer 9 composed of InGaN is set to 700 to 800° C.

The current blocking layer 9 may be composed of GaN in which Si or Zn has been injected as impurities. Alternatively, the current blocking layer 9 may be a current blocking layer 9 in which Si or Zn has been injected as impurities into AlGaN having a lower Al composition ratio than that of the AlGaN cladding layer. Also in this case, the current blocking layer 9 is grown in the transverse direction on the $SiO_2$ film 30, thereby forming a current injection region having a width $W_2$. The substrate temperature in this case is set to 1000 to 1100° C.

Furthermore, the current blocking layer 9 may be formed by stacking layers having different compositions. For example, one or a plurality of AlGaN layers and InGaN layers may be combined, or one or a plurality of GaN layers and InGaN layers may be combined. Alternatively, one or a plurality of AlGaN layers and GaN layers are combined. In this case, the layers are alternately stacked with the thickness of each of the layers set to tens to thousands of angstroms. Consequently, the crystallizability of the current blocking layer 9 is improved. When the current blocking layer 9 having such a stacked structure is formed, the average refractive index in the current blocking layer 9 is set to be lower than the refractive index in the p-AlGaN cladding layer 7. Consequently, a semiconductor laser device 100 having a real refractive index guided structure is realized. Further, when the current blocking layer 9 includes an InGaN layer, the In composition of the InGaN layer is approximately the same as or not less than the In composition of the quantum well layer in the MQW light emitting layer 6. Consequently, light is absorbed in the current blocking layer, so that transverse mode control is carried out. Also in the current blocking layer 9 having such a stacked structure, the current blocking layer 9 is grown in the transverse direction on the $SiO_2$ film 30, thereby forming a current injection region having a width $W_2$. The substrate temperature in this case is set to 700 to 800° C. at the time of growing the InGaN layer, while being set to 1000 to 1100° C. at the time of growing the GaN layer and the AlGaN layer. When the current blocking layer 9 includes an AlGaN layer, it is preferable that the AlGaN layer is grown under reduced pressure.

Although in the above-mentioned embodiment, description was made of a case where each of the layers 2 to 8 in the semiconductor laser device 100 is composed of a nitride semiconductor containing Ga, Al and In, the layer may contain boron and Tl.

Although in the method of fabricating the semiconductor laser device according to the present invention is particularly effective in a GaN based semiconductor laser device in which p-type semiconductor layers have high resistances, so that an injected current is injected into the p-type semiconductor layers below a current blocking layer without being widened, it is also applicable in a semiconductor laser device other than the GaN based semiconductor laser device, for example, a GaAs based semiconductor laser device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device comprising:

a first nitride based semiconductor layer including a light emitting layer and containing at least one of indium, gallium, aluminum, boron and thallium;

a ridge portion formed in a region having a predetermined width on said first nitride based semiconductor layer, having an upper surface having a first width and a side surface, and containing at least one of indium, gallium, aluminum, boron and thallium;

a current blocking layer formed on said first nitride based semiconductor layer and on a region from the side surface of said ridge portion to the upper surface thereof by a transverse growth technique, and having an opening having a second width smaller than said first width on the upper surface of said ridge portion; and a second nitride based semiconductor layer formed on the upper surface of said ridge portion and containing at least one of indium, gallium, aluminum, boron and thallium, wherein an end portion of said current blocking layer is in contact with a part of said second nitride based semiconductor layer formed on the upper surface of said ridge portion, wherein said first nitride based semiconductor layer comprises an n-type cladding layer, said light emitting layer, and a p-type cladding layer, and said ridge portion comprises a part of said p-type cladding layer.

2. The semiconductor laser device according to claim 1, wherein
said current blocking layer is composed of a nitride based semiconductor containing at least one of indium, gallium, aluminum, boron and thallium.

3. The semiconductor laser device according to claim 2, wherein said current blocking layer contains aluminum and gallium.

4. The semiconductor laser device according to claim 2, wherein said current blocking layer contains indium and gallium.

5. A semiconductor laser device comprising:
a first nitride based semiconductor layer including a light emitting layer and containing at least one of indium, gallium, aluminum, boron and thallium;
a ridge portion formed in region having a predetermined width on said first nitride based semiconductor layer, having an upper surface having a first width and a side surface, and containing at least one of indium gallium, aluminum, boron and thallium;
a current blocking layer formed on said first nitride based semiconductor layer and on a region from the side surface of said ridge portion to the upper surface thereof by a transverse growth technique, and having an opening having a second width smaller than said first width on the upper surface of said ridge portion; and
a second nitride based semiconductor layer formed on the upper surface of said ridge portion and containing at least one of indium, gallium, aluminum, boron and thallium, wherein
an end portion of said current blocking layer is in contact with a part of said second nitride based semiconductor layer formed on the upper surface of said ridge portion, wherein
said second nitride based semiconductor layer is formed so as to cover a regio above said opening and a region on said current blocking layer.

6. The semiconductor laser device according to claim 5, further comprising
an electrode formed on said second nitride based semiconductor layer.

7. The semiconductor laser device according to claim 1, wherein said current blocking layer has a single-layer structure.

8. The semiconductor laser device according to claim 1, wherein said current blocking layer has a multi-layer structure.

9. A method of fabricating a semiconductor laser device, comprising the steps of:
forming a first nitride based semiconductor layer including a light emitting layer and containing at least one of indium, gallium, aluminum, boron and thallium;
forming a ridge portion having an upper surface having a first width and a side surface, and containing at least one of indium, gallium, aluminum, boron and thallium in a region having a predetermined width on said first nitride based semiconductor layer;
forming on a region from the side surface of said ridge portion to the upper surface thereof a current blocking layer by a transverse growth technique having an opening having a second width smaller than said first width on the upper surface of said ridge portion; and forming a second nitride based semiconductor layer containing at least one of indium, gallium, aluminum, boron and thallium on the upper surface of said ridge portion in said opening,
forming said first nitride based semiconductor layer comprises the step of forming an n-type cladding layer, said light emitting layer, and a p-type cladding layer in this order, and
forming said ridge portion comprises the step of etching said p-type cladding layer, except in a region having said first width of said p-type cladding layer, wherein
an end portion of said current blocking layer is in contact with a part of said second nitride based semiconductor layer formed on the upper surface of said ridge portion.

10. A method of fabricating a semiconductor laser device, comprising the steps of:
forming a first nitride based semiconductor layer including a light emitting layer and containing at least one of indium, gallium, aluminum, boron and thallium;
forming a ridge portion having an upper surface having a first width and a side surface, and containing at least one of indium, gallium, aluminum, boron and thallium in a region having a predetermined width on said first nitride based semiconductor layer;
forming on a region from the side surface of said ridge portion to the upper surface thereof a current blocking layer by a transverse growth technique having an opening having a second width smaller than said first width on the upper surface of said ridge portion; and
forming a second nitride based semiconductor layer containing at least one of indium, gallium, aluminum, boron and thallium on the upper surface of said ridge portion in said opening, wherein
an end portion of said current blocking layer is in contact with a part of said second nitride based semiconductor layer formed on the upper surface of said ridge portion, wherein
said current blocking layer is composed of a nitride based semiconductor containing at least one of indium, gallium, aluminum, boron and thallium, and
the step of forming said current blocking layer comprises the steps of
forming a striped insulating film on the upper surface of said ridge portion, and
forming said current blocking layer extending to a region, excluding the region having said second width, on the upper surface of said ridge portion from a region on said first nitride based semiconductor layer on both sides of said ridge portion by using a tranverse growth technique.

11. A method of fabricating a semiconductor laser device, comprising the steps of:
forming a first nitride based semiconductor layer including a light emitting layer and containing at least one of indium, gallium, aluminum, boron and thallium;
forming a ridge portion having an upper surface having a first width and a side surface, and containing at least one of indium, gallium, aluminum, boron and thallium in a region having a predetermined width on said first nitride based semiconductor layer;
forming on a region from the side surface of said ridge portion to the upper surface thereof a current blocking layer by a transverse growth technique having an opening having a second width smaller than said first width on the upper surface of said ridge portion; and forming a second nitride based semiconductor layer containing at least one of indium, gallium, aluminum, boron and thallium on the upper surface of said ridge portion in said opening, wherein an end portion of said current blocking layer is in contact with a part of said second nitride based semiconductor layer formed on the upper surface of said ridge portion, wherein the step of forming said second nitride based semiconductor layer comprises the step of forming said second nitride based semiconductor layer for covering a region above said opening and a region on said current blocking layer .

12. The method according to claim 11, further comprising the step of forming an electrode on said second nitride based semiconductor layer.

13. The method according to claim 9, wherein the step of forming said current blocking layer comprises the step of forming a single nitride based semiconductor layer containing at least one of indium, gallium, aluminum, boron and thallium.

14. The method according to claim 9, wherein the step of forming said current blocking layer comprises the step of stacking a plurality of nitride based semiconductor layers containing at least one of indium, gallium, aluminum, boron and thallium.

15. The semiconductor laser device according to claim 3, wherein the ratio of the first width of the upper surface of said ridge portion to the second width of the opening of said current blocking layer is not less than 0.1 nor more than 0.95.

16. The method according to claim 10, wherein said current blocking layer contains gallium and aluminum, and the ratio of the first width of the upper surface of said ridge portion to the second width of the opening of said current blocking layer is not less than 0.1 nor more than 0.95.

\* \* \* \* \*